(12) United States Patent
Van Elp

(10) Patent No.: US 8,105,457 B2
(45) Date of Patent: Jan. 31, 2012

(54) METHOD FOR JOINING AT LEAST A FIRST MEMBER AND A SECOND MEMBER, LITHOGRAPHIC APPARATUS AND DEVICE MANUFACTURING METHOD, AS WELL AS A DEVICE MANUFACTURED THEREBY

(75) Inventor: Jan Van Elp, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 1675 days.

(21) Appl. No.: 10/740,831

(22) Filed: Dec. 22, 2003

(65) Prior Publication Data

US 2005/0132750 A1 Jun. 23, 2005

(51) Int. Cl.
*B29C 65/00* (2006.01)

(52) U.S. Cl. ............ 156/274.4; 156/273.1; 156/272.2; 65/36

(58) Field of Classification Search ............ None
See application file for complete search history.

(56) References Cited

U.S. PATENT DOCUMENTS

| 4,924,701 | A | * | 5/1990 | Delatorre | 73/152.52 |
| 5,441,591 | A | | 8/1995 | Imthurn et al. | 156/153 |
| 2003/0079823 | A1 | | 5/2003 | Sabia | 156/99 |
| 2004/0012767 | A1 | * | 1/2004 | Van Elp et al. | 355/72 |

FOREIGN PATENT DOCUMENTS

EP 1 359 469 A1 11/2003

OTHER PUBLICATIONS

Pigeon, F., Biasse, B., Zussy, M., "Low-temperature Pyrex glass wafer direct bonding", Electronics Letters, v.31,n. 10, (1995), pp. 792-793.*
Andreas Plößl* and Gertrud Kräuter, "Wafer direct bonding: tailoring adhesion between brittle materials", Materials Science and Engineering: R: Reports, vol. 25, Issues 1-2, Mar. 10, 1999, pp. 1-88.*
International Search Report issued for International Application No. PCT/NL2004/000898, dated Nov. 24, 2005.

* cited by examiner

*Primary Examiner* — Jason L. Lazorcik
(74) *Attorney, Agent, or Firm* — Pillsbury Winthrop Shaw Pittman LLP

(57) ABSTRACT

A method for joining at least two members of a lithographic apparatus is disclosed. The method includes providing a first member, providing a second member, direct-bonding the first member and the second member to form a direct-bond, and anodically bonding the first member and the second member. At least one of the members includes ultra low expansion glass and/or ultra low expansion glass ceramics.

7 Claims, 4 Drawing Sheets

METHOD FOR JOINING AT LEAST A FIRST MEMBER AND A SECOND MEMBER, LITHOGRAPHIC APPARATUS AND DEVICE MANUFACTURING METHOD, AS WELL AS A DEVICE MANUFACTURED THEREBY

BACKGROUND OF THE INVENTION

1. Field of the Invention

The present invention relates generally to a lithographic apparatus. More specifically, the present invention relates to a method for joining at least a first member and a second member of the lithographic apparatus.

2. Description of Related Art

A lithographic apparatus is a machine that applies a desired pattern onto a target portion of a substrate. Lithographic apparatus can be used, for example, in the manufacture of integrated circuits (ICs). In that circumstance, a patterning device or structure, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti parallel to this direction.

A lithographic projection apparatus and device manufacturing method are known from the European patent application EP 1359469, having application number EP 03252747.5, which is incorporated herein by reference in its entirety. The known apparatus comprises a chuck for use in holding a substrate or a mask onto a supporting table by electrostatic force. The chuck comprises at least a first member and a second member, which are joined together. The first and second member each comprise ultra low expansion glass ceramics and ultra low expansion glass, having coefficients of thermal expansion of less than about $0.1 \times 10^{-6} K^{-1}$, particularly less than about $0.02 \times 10^{-6} K^{-1}$, for example, ZERODUR™ and ULE™.

In EP 1359469, a method for joining the first member and second member is described, wherein the members are joined together using anodic bonding. An advantage of anodic bonding is that materials with strong degassing, for example, glue, are not needed to make the bond between the first and second member, neither is frit fusion applied, nor thermal fusion. In frit fusion, low melting frits (powders) of a glass material are added to a joint to glue pieces together when heated. In thermal fusion, pieces of material are melted at the joint at high temperature. Both frit fusion and thermal fusion have a process temperature which is above the usage temperature of glass ceramics. Therefore, frit fusion and thermal fusion may lead to an undesired degradation of the bonding surfaces of the joined members, for example, from materials or optical point of view.

Anodic bonding results in a firm bond between the ultra low expansion members. Anodic bonding is particularly advantageous for providing strong bonds between ultra low expansion glass ceramic members comprising, for example, ZERODUR™ and ultra low expansion glass members comprising, for example, ULE™. The known method for joining a plurality of members together is applicable, for example, for manufacturing chucks, substrate tables, mask tables, mirrors, and the like.

A disadvantage of the known method for joining at least a first member and a second member is that it has a fair chance of failure. For example, it is relatively difficult to obtain a desired anodic bond between the first and second member having a substantially clean bonding surface. Contamination may, for example, be trapped between the first and second member when the anodic bond has been formed. Such contamination can comprise particles, dust, atomic clusters, and the like. The contamination may impair certain desired properties of the first and second member, for example, optical properties, properties relating to diffraction, reflection and/or transmission of a radiation beam, and the like. The contamination may also impair material properties of the first and second member concerning, for example, a desired homogeneity, crystal structure, and the like. The trapped contamination may lead to material defects, surface distortions, dislocations and/or cracks of the first and/or second member at the time of bonding or after they have been joined together using anodic bonding. Such defects may occur after the anodic bonding, for example, during further treatment or processing of the joined members, such as during a subsequent removal of material from one or more of the joined members. Moreover, the material defects may lead to a further degradation of desired optical properties of the first and/or second member. One or more contaminating particles may damage the first an/or second member such that the anodically bonded members are unusable and have to be discarded, thereby leading to a waste of materials, time and money.

Moreover, it may be desirable to bond the members in a certain alignment with respect to each other. In case the members are found to be misaligned after the bonding process, the members may also have to be discarded, as a result of having become unusable.

SUMMARY OF THE INVENTION

It is an aspect of embodiments of the present invention to provide an alternative and/or improved method for joining at least a first and a second member, wherein particularly at least one of the members comprises ultra low expansion glass or ultra low expansion glass ceramics. It is also an aspect of embodiments of the invention to provide a method for joining at least a first and second member, in which the method is economical in terms of, for example, the amounts of materials, time, and/or money involved.

According to an aspect of the invention, there is provided a method for joining at least a first member and a second member, wherein at least one of the members comprises a material which is selected from the group consisting of ultra low expansion glass, and ultra low expansion glass ceramics, wherein the members are joined using direct-bonding before anodic bonding.

According to embodiments of the invention, a method for joining at least two members of a lithographic apparatus is provided. The method includes providing a first member, providing a second member, direct-bonding the first member and the second member to form a direct-bond, and anodically bonding the first member and the second member. At least one of the members includes a material which is selected from the group consisting of ultra low expansion glass and ultra low expansion glass ceramics.

For example, the ultra low glass expansion glass ceramic may comprise at least one of the materials selected from the group consisting of: ZERODUR™, NEOCERAM™, ASTROSITAL™, and CLEARCERAM™.

The ultra low expansion glass may, for example, contain one or more weight percent of titanium atoms. The ultra low expansion glass may be, for example, ULE™. On the other hand, the second member may also comprise ultra low expansion glass ceramics.

When the first and second member are joined by direct-bonding, a relatively weak direct-bond, also known as contact-bond, is obtained. The direct-bonding of several elements as such is known from the art, see, for example, the article "Contact bonding, including direct-bonding in a historical and recent context of materials science and technology, physics and chemistry" "Historical review in a broader scope and comparative outlook" of Jan Haisma et al., Materials Science & Engineering, R37, nos. 1-2, 5 Apr. 2002, Elsevier Science B.V. This article is incorporated herein by reference. A possible definition of direct-bonding is given on page 7 of this article. Direct-bonding is also known as wringing, 'contact optique' (French), ansprengen (German) or 'van der Waals bonding' (Dutch).

According to embodiments of the present invention, it is advantageous to combine direct-bonding with anodic bonding for joining at least a first and second member, wherein at least one the members comprises ultra low expansion glass or ultra low expansion glass ceramics. In direct-bonding, the first and second member are joined directly, contacting each other at respective bonding surfaces, without using any adhesive, glue or the like. Each of the members to be joined is solid during the direct-bonding process. The resulting, relatively weak, direct-bond is strong enough to hold the first and second member together. However, the direct-bond can be easily broken, without damaging the first and second member. It is generally believed that the direct-bond is achieved due to intermolecular van der Waals forces which come about between the first and second member when the first and second member are joined by their direct-bonding surfaces. As with anodic bonding, no adhesive is used in the direct-bonding process. Direct-bonding may be carried out, for example, at room temperature. Therefore, optical and material properties of the first and second member can be well-maintained during the direct-bonding process.

For the case when certain contamination is present between the first and second member, it might not be possible to form a direct-bond between the members at all. Then, the first and/or second member may be subjected to a certain treatment to remove such contamination, for example, cleaning, polishing, rinsing and the like, using suitable treatment substances, for example, fluids, liquids, gasses, chemicals, polishing means, and the like. After such treatment, the direct-bonding of the first and second member may be tried again.

After the direct-bonding has been successful, the joined members are further bonded by anodic bonding, resulting in a stronger bond between the first and second member. For example, the anodic bonding may be used to strengthen the direct-bond which is already present.

According to a further aspect of the invention, a direct-bond, arising from the direct-bonding of the first and second member, may be subjected to inspection first before the anodic bonding is carried out. The members may be inspected, for example, to detect certain bonding defects which may come about. A fault may be, for example, a certain misalignment of the first and second member with respect to each other. The faults may also comprise contamination, particles, dust or the like, which may be trapped between the first and second member. The faults or defects may also comprise other imperfections.

At least one of the members may be inspected for faults after the direct bonding. For example, certain material and/or optical properties of at least one of the members may be inspected for faults. Faults may comprise, for example, deviations from a certain desired surface shape or surface flatness, deformation of one or more of the members, deformation of a certain mirror-surface, and the like.

Preferably, when one or more faults are found, the direct-bond is broken before the anodic bonding is carried out. The breaking of the direct-bond can be carried out relatively easily, since the strength of that bond is relatively low. Then, after the breaking of the direct-bond, the detected fault or faults may be removed, whereafter the first and second member are joined again by direct-bonding. Preferably, the resulting direct-bond is inspected yet again according to the afore described method, until a good direct-bond has been observed. The anodic bonding of the first and second member is preferably only carried out when no or substantially no faults are detected anymore. Therefore, the first and second member are only connected firmly to each other after they have been properly joined by direct-bonding. In this way, failure of the anodic bonding may be prevented, so that the first and second member can be joined economically. Such substantially fault free bonding of the first and second member may uphold or lead to certain desired properties of the first and second member, for example, certain materials properties, optical properties, properties relating to diffraction, reflection and/or transmission of one or more radiation beams, and the like.

According to an aspect of the invention, the first member and second member are provided with direct-bonding surfaces, wherein the direct-bonding surfaces are joined, such that a direct-bond is obtained between the first and second member, wherein the direct-bond is strengthened using the anodic bonding.

The direct-bonding surfaces may provide for a proper direct-bonding of the first and second member. The direct-bonding surfaces may be provided, using polishing techniques, cleaning treatment, and the like. The direct-bonding surfaces may be, for example, substantially flat surfaces. A direct-bonding surface may be a surface of the first and/or second member as such. The first and/or second member may be provided with a direct-bonding layer for providing a direct-bonding surface. Such a direct-bonding layer may comprise, for example, at least one of the compounds selected from the group consisting of a native oxide, for example, a native oxide of a metal or a native oxide of a semiconductor material, which semiconductor material is, for example, doped or undoped and comprises, for example, Si and/or Ge atoms; a metal oxide; and a semiconductor oxide, comprising, for example, Si and/or Ge atoms.

According to a further aspect of the invention, at least the second member is at least provided with an electrically conductive layer, wherein the electrically conductive layer is used as a first electrode in the anodic bonding of the members.

The anodic bonding can be carried out using the first electrode as provided by the electrically conductive layer. The electrically conductive layer may be provided with or comprise at least one of the direct-bonding surfaces. For example, the direct-bonding layer may be provided onto the electrically conductive layer, for example, as an additionally applied or deposited layer. Also, the electrically conductive layer may comprise, for example, a native oxide serving as direct-bonding layer.

According to an advantageous aspect of the invention, the at least first and second member are joined for forming part of a lithographic apparatus.

Therefore, the lithographic apparatus part can be formed economically, using at least one bond which may be relatively strong, free from degassing adhesives, as well as substantially contamination free, wherein certain desired materials and/or optical properties of the members are obtained and/or maintained. The first and second member can be joined with high precision, for example, with a certain alignment, leading to an accurate manufacturing of the lithographic apparatus part. The resulting lithographic apparatus part may provide for a high precision manufacturing of devices, during use of the lithographic apparatus in a device manufacturing method.

According to a further aspect of the invention, there is provided a lithographic apparatus comprising: an illumination system for providing a projection beam of radiation; a support structure for supporting a patterning device, the patterning device serving to impart the projection beam with a pattern in its cross-section; a substrate table for holding a substrate; and a projection system for projecting the patterned beam onto a target portion of the substrate, characterized in that at least part of the apparatus is manufactured using a method according to any of the method claims.

This provides the above-mentioned advantages to the apparatus. For example, at least part of the support structure for supporting a patterning device, at least part of the substrate table, at least part of the projection system and/or at least part of a chuck is manufactured using a method according to any of the method claims. The chuck may be, for example, a substrate chuck or a reticle chuck. The chuck may be arranged for holding a substrate or reticle by electrostatic force.

According to embodiments of the invention a lithographic apparatus is provided. The lithographic apparatus includes an illumination system that provides a beam of radiation, and a support structure that supports a patterning structure. The patterning structure is configured to impart the beam of radiation with a pattern in its cross-section. The apparatus also includes a substrate support that supports a substrate, and a projection system that projects the patterned beam onto a target portion of the substrate. The apparatus also includes first and second members that are direct-bonded and anodically bonded to one another. At least one of the members includes a material which is selected from the group consisting of ultra low expansion glass and ultra low expansion glass ceramics.

According to a another aspect of the invention, a chuck for a lithographic apparatus is provided. The chuck includes a first member with a coefficient of thermal expansion of less than about $0.1 \times 10^{-6} K^{-1}$, and a second member with a coefficient of thermal expansion of less than about $0.1 \times 10^{-6} K^{-1}$. The first member is direct-bonded to the second member and then anodically bonded to the second member.

According to a further aspect of the invention, there is provided a device manufacturing method comprising: providing a substrate; providing a projection beam of radiation using an illumination system; using a patterning device to impart the projection beam with a pattern in its cross-section; and projecting the patterned beam of radiation onto a target portion of the substrate, characterized in that the method is carried out using an apparatus according to the apparatus claims.

This provides the above-mentioned advantages to the device manufacturing method.

According to another aspect of the invention, a device is provided, wherein the device is manufactured by an apparatus according to any of the apparatus claims.

According to a further aspect of the invention, a device is provided, wherein the device is manufactured by a method according to any of the device manufacturing method claims.

Such device can be manufactured relatively economically, particularly inexpensively, and with high precision.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" or "patterning structure" as used herein should be broadly interpreted as referring to a device or structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device or structure may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions, In this manner, the reflected beam is patterned. In each example of the patterning structure, the support structure may be a frame or table, for example, which may be fixed or movable as required and which may ensure that the patterning device is at a desired position, for example with respect to the projection system. Any use of the terms "reticle" or "mask" herein may be considered synonymous with the more general terms "patterning device" or "patterning structure."

The term "projection system" as used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Embodiments of the invention will now be described, by way of example only, with reference to the accompanying schematic drawings in which corresponding reference symbols indicate corresponding parts.

DETAILED DESCRIPTION OF EMBODIMENTS OF THE INVENTION

Figure 1:
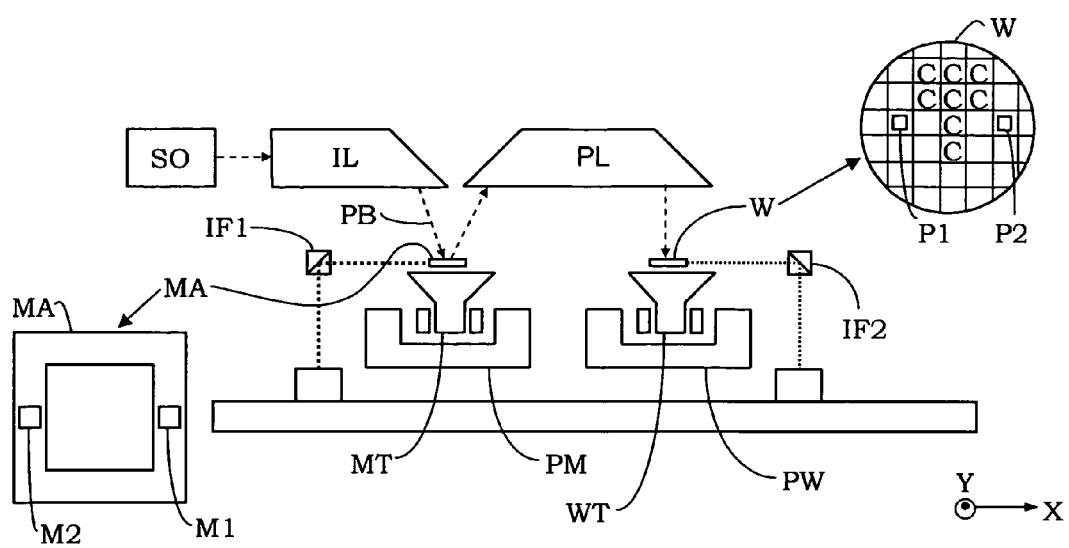
FIG. 1 depicts a lithographic apparatus according to embodiments of the invention.

FIG. 1 schematically depicts a lithographic apparatus according to the invention. The apparatus comprises: an illumination system (illuminator) IL for providing a projection beam PB of radiation (e.g. UV or EUV radiation); a first support structure (e.g. a mask table) MT for supporting a patterning device (e.g. a mask) MA and connected to a first positioning device PM for accurately positioning the patterning device with respect to item PL; a substrate table (e.g. a wafer table) WT for holding a substrate (e.g. a resist coated wafer) W and connected to a second positioning device PW for accurately positioning the substrate with respect to item PL; and a projection system (e.g. a reflective projection lens) PL for imaging a pattern imparted to the projection beam PB by a patterning device MA onto a target portion C (e.g. comprising one or more dies) of the substrate W. The term "substrate table" as used herein can also be considered or termed as a substrate support. It should be understood that the term substrate support or substrate table broadly refers to a structure that supports, holds, or carries a substrate.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases, the source may be integral part of the apparatus, for example when the source is a mercury lamp. The source SO and the illuminator IL, may be referred to as a radiation system.

The illuminator IL may comprise an adjusting device for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
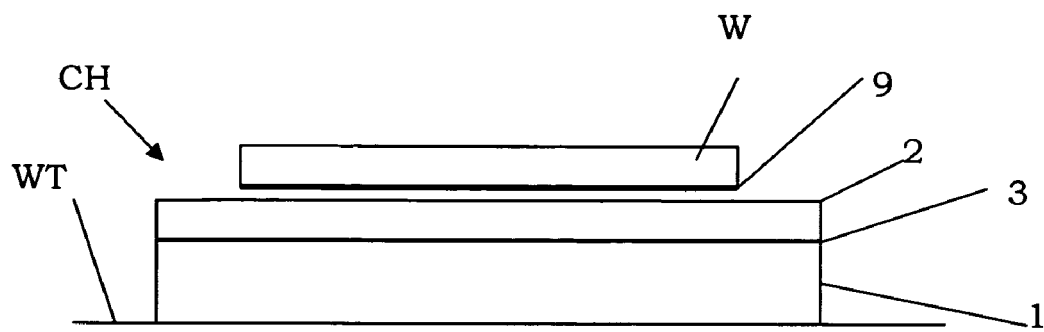
FIG. 2 schematically shows a first embodiment of the present invention.

FIG. 2 shows a first embodiment of the invention, comprising a chuck CH which may be used in the apparatus of FIG. 1. The chuck CH is not shown in FIG. 1. In the present embodiment, the chuck CH is used to hold substrates W onto the substrate table WT by electrostatic force. The chuck may also be used, for example, to hold the reticle onto the reticle table.

The chuck CH of the first embodiment comprises a first member 1 and a second member 2. A first electrode 3 extends between the first and second member 1, 2. The first electrode is an electrically conductive layer 3. The electrically conductive layer 3 preferably comprises one or more suitable conducting substances, for example, copper, aluminium, titanium, silver, gold, chrome, alloys thereof, other metals, and/or other alloys.

Each of the members 1, 2 comprises a material which is selected from the group consisting of: ultra low expansion glass, and ultra low expansion glass ceramics. In the present embodiment, the first member 1 comprises ultra low expansion glass ceramics, consisting, for example, of: ZERODUR™ which is manufactured by Schott Glas, Mainz, Germany; NEOCERAM™, of Nippon Electric Glass; ASTROSITAL™, also known as Sitall; or CLEARCERAM™ of Ohara Corp.

The first member has a near zero coefficient of thermal expansion, and particularly a coefficient of thermal expansion of less than about $0.02 \times 10^{-6} K^{-1}$ (relative expansion/contraction per unit temperature). The material of the first member 1 preferably has a specific resistivity of less than about $10^{16}$ Ωcm and more preferably less than about $10^{14}$ Ωcm. The first member 1 may comprise, for example, alkali charge carriers or the like.

In the present embodiment, the second member 2 of the chuck CH is made of a dielectric glass material. The second member 2 also has a near zero coefficient of thermal expansion, and particularly a coefficient of thermal expansion of less than about $0.02 \times 10^{-6} K^{-1}$ (relative expansion/contraction per unit temperature). Further, the material of the second member 2 preferably has a specific resistivity of at least about $10^{16}$ Ωcm, and more preferably of at least about $10^{17}$ Ωcm. The second member 2 may comprise, for example, a glass containing titanium atoms, for example, ULE™.

As is depicted in FIG. 2, the chuck CH is mounted on the substrate table WT. A substrate W is also provided with an electrically conductive layer 9, serving as a substrate electrode. During use, the substrate W may be held by the chuck CH by applying a potential difference between the first electrode 3 and the electrode 9 of the substrate W, using electrostatic force, as has been described in EP 1359469.

FIGS. 3-6 show a method for manufacturing part of the chuck CH as depicted in FIG. 2. The chuck part, to be manufactured, at least comprises the first member 1, the second member 2 and the first electrode 3. The manufacturing comprises a direct-bonding step, followed by an anodic bonding step.

Figure 3:
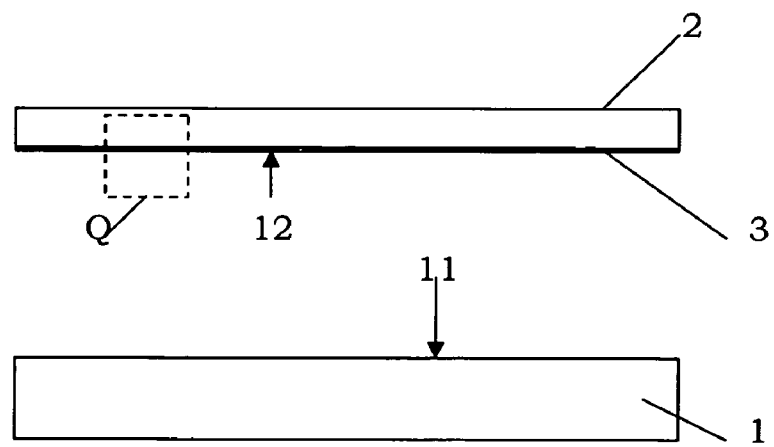
FIG. 3 shows a first step of a manufacturing method for forming part of the embodiment shown in FIG. 2.
Figure 4:
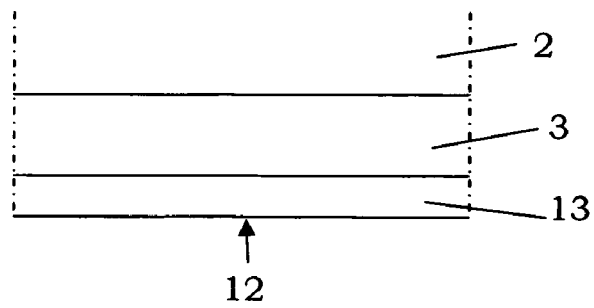
FIG. 4 shows a detail Q of FIG. 3.

As is shown in FIG. 3, the first member 1 is provided with a direct-bonding surface 11. Preferably, this surface is a substantially flat, substantially contamination free, outer surface 11 of the first member 1.

A surface of the second member 2 is provided with an electrically conductive layer 3 for providing the first electrode. This conductive layer 3 can be provided in different ways, for example, using coating techniques, deposition techniques, chemical vapor deposition, evaporation, spraying, immersing, and the like.

The first electrode 3 of the second member 2 is provided with a direct-bonding surface 12. This is achieved by applying a direct-bonding layer 13 onto an outer surface of the first electrode 3, as has been shown in FIG. 4. This direct-bonding layer 13 provides a desired direct-bonding surface 12 to the second member 2. Preferably, this direct-bonding surface 12 is a substantially flat, substantially contamination free, outer surface 12 of the direct-bonding layer 13. To this aim, the respective surface of the direct-bonding layer 13 may be, for example, subjected to a suitable treatment, for example, cleaning, rinsing, smoothening and/or polishing. On the other hand, the outer surface 12 of the direct-bonding layer may be found to be suitable for direct-bonding without such treatment, after the direct-bonding layer 13 has been applied to the second member 2. The direct-bonding layer 13 may be, for example, provided onto the first electrode 3 using a suitable deposition and/or coating technique, for example vapor deposition, CVD, evaporation, immersing, spraying and the like.

The direct-bonding layer 13 may comprise, for example, at least one of the compounds selected from the group consisting of: a native oxide, for example, a native oxide of a metal or a native oxide of a semiconductor material, in which the semiconductor material is, for example, doped or undoped and comprises, for example, Si and/or Ge atoms or other semiconductors; a metal oxide; and a semiconductor oxide, comprising, for example, Si atoms, Ge atoms, a combination of Si and Ge atoms, and/or other semiconductors.

The native oxide may also be, for example, a native oxide of the first electrode 3. Such a native oxide may be already present, soon after the first electrode 3 has been formed onto the second member 2, depending on the substances used for forming the first electrode 3. In that case, the electrically conductive layer 3 is provided with a natural direct-bonding layer 13 having a direct-bonding surface 12.

Alternatively, a further oxidation of the outer surface of the first electrode 3 may be carried out for providing a direct-bonding layer 13 with a direct-bonding surface 12, also depending whether the material of the first electrode 3 is suitable for that purpose.

Furthermore, the electrically conductive layer 3 as such may comprise a suitable direct-bonding surface, depending whether the electrically conductive layer 3 is suitable to form a direct-bond with the first member 1. In that case, no separate direct-bonding layer has to be used or applied.

Figure 5:
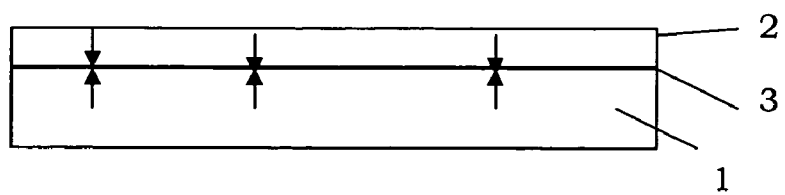
FIG. 5 shows a second step of a manufacturing method for forming part of the embodiment shown in FIG. 2.

As is shown with arrows in FIG. 5, the direct-bonding surfaces 11, 12 are joined, such that a direct-bond is obtained between the first and second member 1, 2. The joining is simply achieved by bringing the first and second member 1, 2 together, with the direct-bonding surfaces 11, 12 facing towards each other, such that the direct-bonding surfaces 11, 12 make direct contact with one another. A direct-bond may be achieved when the bonding surfaces 11, 12 are sufficiently clean and flat, such that substantially no gaps remain there between after the surfaces 11, 12 have been pressed onto each other.

When no direct-bond can be made, or a bad direct-bond appears to have been made, the first and second member 1, 2 are removed from one another. The members 1, 2 are then preferably inspected for certain faults which could negatively affect the direct-bonding process. Then, the members 1, 2 are preferably treated to remove such faults.

For the case that a direct-bond has been made or appears to have been made between the first and second member 1, 2, preferably, the resulting bond is inspected for faults, for example, concerning misalignment, contamination, particles, dust or the like. Then, the direct-bond is broken when one or more faults are found, so that detected faults may be removed.

The inspection of each direct-bond may be carried out in different ways, for example, using electrical, mechanical and/or optical measuring techniques. An advantageous inspection technique involves the use of optical interference. Trapped matter, for example, particles and the like, may lead to one or more gaps extending between the direct-bonding layers 11, 12 of the first and second member 1, 2. Usually, such gaps can easily be made visible, since they may lead to interference of incident light waves, for example, resulting in Newton rings or suchlike interference patterns. For the case that a good direct-bond has been obtained, the bonding surface will appear to be 'black', i.e. substantially no interference patterns and/or reflections from the bonding surfaces 11, 12 will be observed. Depending on the composition of the first member 1, the second member 2 and the conducting layer 3, optical measurements may involve, for example, light reflection, light diffraction and/or light transmission through the first member 1, second member 2 and/or conducting layer 3. The light may involve visible light, X-rays, and/or other electromagnetic radiation.

Figure 6:
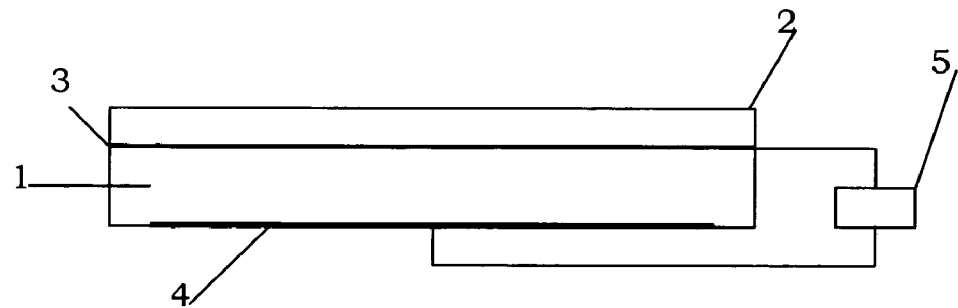
FIG. 6 shows a third step of a manufacturing method for forming part of the embodiment shown in FIG. 2.

Preferably, the first and second member 1, 2 are joined by direct-bonding again and again in the above described manner, until a resulting direct-bond passes the inspection. After the direct-bond between the first and second member 1, 2 has passed the inspection, the direct-bond is strengthened by anodic bonding, as has been shown in FIG. 6. To this aim, the first member 1 is provided with a second electrode 4, on a surface opposite the first electrode 3. The second electrode 4 can be provided in different ways, for example using painting or coating techniques, deposition techniques, chemical vapour deposition, evaporation, spraying, immersing, and the like. Then, the anodic bonding is carried out by heating the ensemble to an appropriate temperature and by applying a potential difference between the first electrode 3 and second electrode 4 to drive an ion current therebetween for forming an anodic bond. In FIG. 6, a suitable current source 5 is used for providing the potential difference. The method of joining the first and second member by anodic bonding as such has been described in EP 1359469. The resulting anodic bond is relatively strong.

Figure 7:
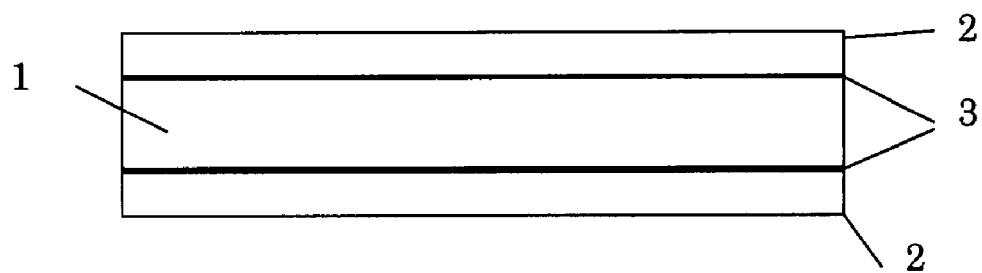
FIG. 7 shows a second embodiment of the invention.

FIG. 7 shows a second embodiment of the invention. In this embodiment, two second members 2 are bonded onto a first member 1. Between the first member 1 and each second member 2, an electrically conductive layer 3 is provided. Preferably, each second member 2 has been joined to the first member 1 by the above described method, using direct-bonding, as well as anodic bonding. The second embodiment can be used as, or as part of a chuck CH, which can hold a substrate W or mask MA using electrostatic force, wherein the chuck CH can be held by a suitable substrate table WT or mask table MT also using electrostatic force.

Figure 8:
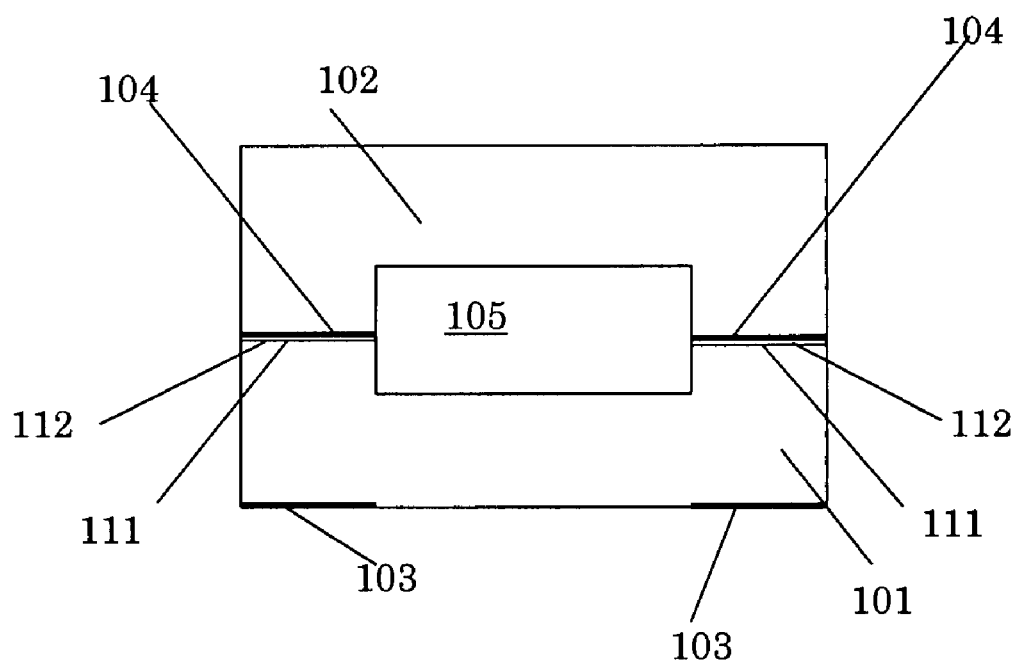
FIG. 8 shows a third embodiment of the invention.

In the third embodiment, shown in FIG. 8, a first member 101 and a second member 102 have been joined using direct-bonding and anodic bonding. The first and second member 101, 102 may be made of the same or different materials. For example, both members 101, 102 may consist of a glass ceramic material. The members 101, 102 may have different forms, shapes and/or sizes. In the third embodiment, the first and second member 101, 102 at least partly enclose a space 105. The first and second member 101, 102 may be, for example, at least part of an optics box and/or of a projection system of a lithographic apparatus or suchlike instrument. For example, at least one or more optics may be located or extend in the interior space 105. Such optics are not shown in FIG. 8.

The first and second member 101, 102 of the third embodiment have been bonded directly onto each other, at opposite bonding surfaces 111, 112, using direct-bonding. The resulting bond has been improved using a further anodic bonding of the first and second member 101, 102. As has been shown, an outer surface of the first member 101 has been provided with electrodes 103. The bonding surface 112 of the second member 102 has also been provided with electrodes 104, which extend between the first and second member 101 102 after the direct-bonding of the members 101, 102. The electrodes 103, 104 are used in the anodic bonding. The anodic bonding is achieved by applying a potential difference between the electrodes 103, 104 to drive an ion current therebetween for forming an anodic bond at the bonding surfaces 111, 112, similar to the embodiment shown in FIG. 6.

While specific embodiments of the invention have been described above, it will be appreciated that the invention may be practiced otherwise than as described. The description is not intended to limit the invention.

For example, the method may be used in or for the semiconductor industry, lithography, optics, space technology, and the like.

In the present application, the term "direct-bonding" can also be understood as being "contact bonding" or "direct-bonding as a contact bond".

At least the first member and the second member may be joined to form various structures and products. The assembly of at least the first and second members may be, for example, part of a lithography apparatus, a chuck, chuck parts, at least part of a projection system, projection optics, at least part of a projection optics box, a patterning device, a mask, a substrate, a mirror, a lens, a shield, and/or other objects.

It should be understood that the bonding surfaces can have different shapes. The bonding surfaces may be, for example, enantiomorphic surfaces, flat surfaces, and the like.

What is claimed is:

1. A method for joining at least two members of a lithographic apparatus, the method comprising:
    direct-bonding a first member of the lithographic apparatus and a second member of the lithographic apparatus at room temperature to form a direct-bond that holds said first member and said second member together, the direct-bond comprising molecular interaction between material of said first and second members, at least one of said members comprises a material which is selected from the group consisting of ultra low expansion glass and ultra low expansion glass ceramics;
    anodically bonding said first member and said second member after said direct-bonding;
    inspecting at least one of said members for at least one fault after said direct bonding; and
    breaking the direct-bond before said anodically bonding when said fault is found.

2. The method according to claim 1, further comprising:
removing said fault after the breaking the direct-bond; and
direct-bonding the first and second members again.

3. A method for joining at least two members of a lithographic apparatus, the method comprising:
   direct-bonding a first member of the lithographic apparatus and a second member of the lithographic apparatus to form a direct-bond that holds said first member and said second member together, the direct-bond comprising molecular interaction between material of said first and second members, at least one of said members comprising a material which is selected from the group consisting of ultra low expansion glass and ultra low expansion glass ceramics;
   inspecting the direct-bond arising from the direct-bonding of said first and second member for at least one fault;
   anodically bonding said first member and said second member after said direct-bonding; and
   breaking the direct-bond before said anodically bonding when said fault is found.

4. The method according to claim 3, wherein said fault comprises at least one of a misalignment between said first and second member, a presence of particles, and a presence of dust.

5. The method according to claim 3, wherein said inspecting is done optically.

6. The method according to claim 5, wherein said inspecting is done using interference.

7. The method according to claim 3, further comprising:
removing said fault after the breaking the direct-bond; and
direct-bonding the first and second members again.

* * * * *